(12) United States Patent
Uekusa

(10) Patent No.: US 9,627,291 B2
(45) Date of Patent: Apr. 18, 2017

(54) SEMICONDUCTOR DEVICE AND ELECTRONIC DEVICE

(71) Applicant: FUJITSU LIMITED, Kawasaki-shi, Kanagawa (JP)

(72) Inventor: Shinichiro Uekusa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 101 days.

(21) Appl. No.: 14/672,729

(22) Filed: Mar. 30, 2015

(65) Prior Publication Data

US 2015/0311135 A1    Oct. 29, 2015

(30) Foreign Application Priority Data

Apr. 23, 2014    (JP) .................................. 2014-089112

(51) Int. Cl.

| H05K 7/00 | (2006.01) |
|---|---|
| H01L 23/34 | (2006.01) |
| H01L 23/00 | (2006.01) |
| H05K 1/11 | (2006.01) |
| H05K 1/18 | (2006.01) |
| H01L 23/467 | (2006.01) |

(52) U.S. Cl.
CPC ............ *H01L 23/345* (2013.01); *H01L 24/17* (2013.01); *H05K 1/111* (2013.01); *H05K 1/181* (2013.01); *H01L 23/467* (2013.01); *H01L 2224/16225* (2013.01); *H01L 2924/014* (2013.01); *H01L 2924/15174* (2013.01); *H01L 2924/15311* (2013.01); *H05K 2201/10219* (2013.01)

(58) Field of Classification Search
CPC ......... H01L 2224/16225; H01L 23/345; H01L 23/467; H01L 24/17; H01L 2924/014; H01L 2924/15174; H01L 2924/15311; H05K 1/111; H05K 1/181; H05K 2201/10219

See application file for complete search history.

(56) References Cited

U.S. PATENT DOCUMENTS

| 4,561,006 A * | 12/1985 | Currie ................... H01L 23/345 257/697 |
|---|---|---|
| 5,645,123 A | 7/1997 | Doi et al. |
| 6,031,729 A * | 2/2000 | Berkely ................ H01L 23/345 219/209 |
| 2004/0035840 A1* | 2/2004 | Koopmans ............ H01L 23/345 219/209 |
| 2006/0164111 A1* | 7/2006 | Lopez ...................... G01K 1/16 324/750.03 |

FOREIGN PATENT DOCUMENTS

| JP | 07-201919 A | 8/1995 |
|---|---|---|
| JP | 2008-537637 A | 9/2008 |

* cited by examiner

*Primary Examiner* — Yuriy Semenenko
(74) *Attorney, Agent, or Firm* — Squire Patton Boggs (US) LLP

(57) ABSTRACT

A semiconductor device includes: a substrate; a semiconductor chip mounted over the substrate and having a solder bump coupled by soldering with an electrode over the substrate; and a heating unit for locally generating heat in a corner part within the horizontal plane of the semiconductor chip when an operating temperature of the semiconductor chip is equal to or less than a prescribed temperature.

3 Claims, 14 Drawing Sheets

FIG. 7

|  |  | ΔTH | | |
|---|---|---|---|---|
|  |  | 10[°C] | 20[°C] | 30[°C] |
| THmax | 40[°C] | 44 [TIME/DAY] | 6 [TIME/DAY] | 2 [TIME/DAY] |
|  | 60[°C] | 29 [TIME/DAY] | 4 [TIME/DAY] | 1.3 [TIME/DAY] |
|  | 80[°C] | 20 [TIME/DAY] | 2.5 [TIME/DAY] | 0.9 [TIME/DAY] |

SEMICONDUCTOR DEVICE AND ELECTRONIC DEVICE

CROSS-REFERENCE TO RELATED APPLICATION

This application is based upon and claims the benefit of priority of the prior Japanese Patent Application No. 2014-089112, filed on Apr. 23, 2014, the entire contents of which are incorporated herein by reference.

FIELD

The embodiment discussed herein is related to a semiconductor device and an electronic device.

BACKGROUND

BGA packages which include a semiconductor chip (silicon die) mounted with a flip-chip connection onto a substrate having soldered outer balls arrayed in a grid pattern are well-known as semiconductor components (also referred to as "semiconductor devices" below). These types of BGA packages often use a construction in which protrusions for connecting so-called solder bumps are provided on a plurality of electrodes arrayed on the outer surface of the semiconductor chip so that electrodes on the substrate side are connected to electrodes on the semiconductor chip side through the solder bumps.

However, because the thermal expansion coefficients of the semiconductor chip and the substrate in a semiconductor device are normally different, there is a possibility the solder connection parts (joints) in the semiconductor device may be subject to stress due to heating (temperature) cycles caused by the semiconductor chip being turned on and off. Moreover, the solder connection parts may also undergo stress due to changes in the calorific content of the semiconductor chip due to changes in the operating conditions such as changes in the amount of signals for processing in the semiconductor chip. As a result, the solder connection parts may crack which may lead to disconnections. This reduction in the joint reliability of the solder connection parts is often exposed with the advance in size reductions and pitch reductions of the solder bumps and solder outer balls accompanying the reduction in the sizes of the packages.

The following are reference documents.
[Document 1] Japanese Laid-Open Patent Publication No. 07-201919 and
[Document 2] Japanese National Publication of International Patent Application No. 2008-537637.

SUMMARY

According to an aspect of the invention, a semiconductor device includes: a substrate; a semiconductor chip mounted over the substrate and having a solder bump coupled by soldering with an electrode over the substrate; and a heating unit for locally generating heat in a corner part within the horizontal plane of the semiconductor chip when an operating temperature of the semiconductor chip is equal to or less than a prescribed temperature.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a view illustrating allowable cycle numbers corresponding to an allowable temperature fluctuating range and an upper limit temperature;

DESCRIPTION OF EMBODIMENT

An embodiment pertaining to a semiconductor device and an electronic device provided with the semiconductor device will be discussed hereinbelow with reference to the drawings.

(Embodiment)

Figure 1:
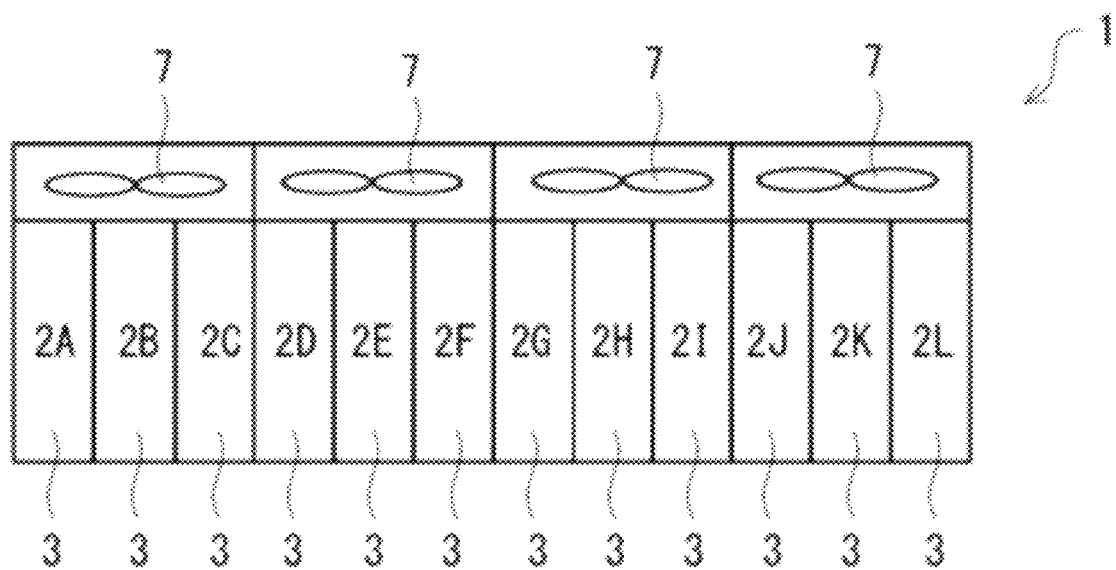
FIG. 1 is a schematic view of an optical transmission device according to an embodiment.
Figure 2:
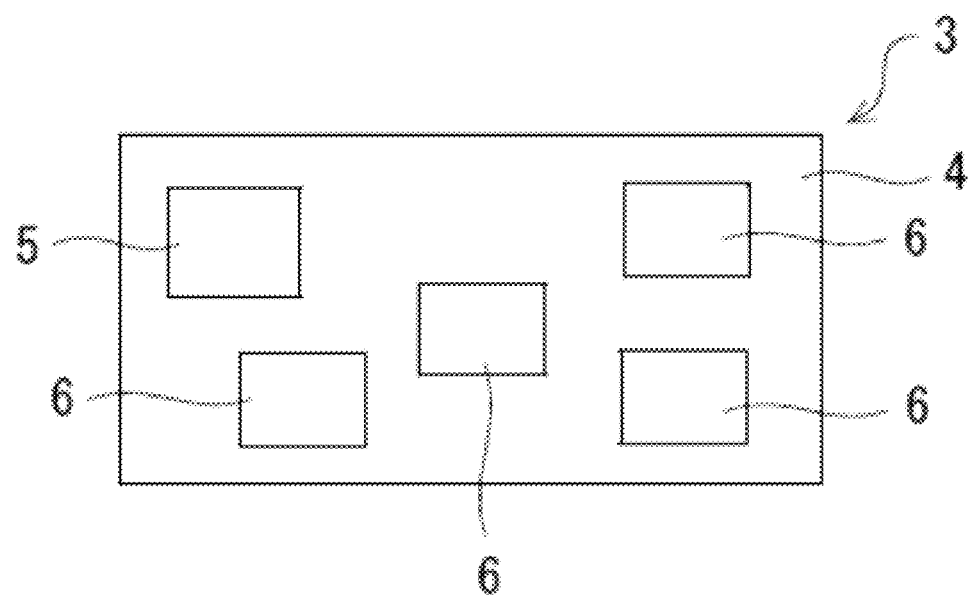
FIG. 2 is a view illustrating a substrate unit according to the embodiment.

FIG. 1 is a schematic view of an optical transmission device 1 which is an example of an electronic device according to the embodiment. The optical transmission device 1 has a plurality of slots 2A to 2L (described below as "slots 2" when the slots 2A to 2L are referred to collectively). Substrate units 3 depicted in FIG. 2 are mounted into the slots 2 of the optical transmission device 1 in a manner that allows insertion and removal. The substrate units 3 have a main board (card) 4 which is a printed board, and a central processing unit (CPU) 5 and field-programmable gate arrays (FPGA) 6 mounted on the main board 4. The FPGAs 6 are integrated circuits that may be freely designed by a user such as a purchaser or a designer after manufacturing as internal logical circuits (user circuits), and represent an example of a semiconductor component (also referred to as a semiconductor device).

In the example illustrated in FIG. 2, the substrate unit 3 includes four FPGAs 6 but the number of FPGAs 6 is not limited thereto. Furthermore, the optical transmission device 1 has a cooling fan 7 for cooling the substrate units 3 together mounted in the plurality of slots 2, that is, all of the plurality of substrate units 3. The optical transmission device 1 is provided with four cooling fans 7 in the example illustrated in FIG. 1 so that one cooling fan 7 cools three substrate units 3 altogether. However, the number of cooling fans 7 mounted on the optical transmission device 1 is not limited to this number and the number of substrate units 3 cooled by each cooling fan 7 is also not limited in particular.

Figure 3:
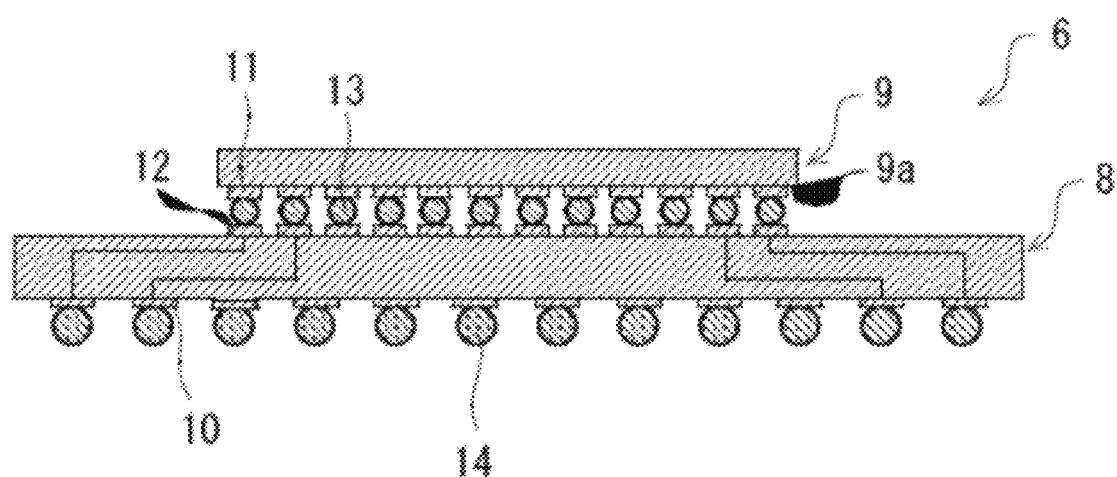
FIG. 3 is a view illustrating a cross-section structure of an FPGA according to the embodiment.

The FPGA 6 will be described next as an example of a semiconductor device according to the present embodiment. FIG. 3 is a view illustrating a cross-section structure of the FPGA 6 according to the embodiment. The FPGA 6 is a so-called flip-chip ball grid array (BGA) package. The FPGA 6 is provided with a package substrate 8, a semiconductor chip 9 mounted on the package substrate 8, a plurality of electrodes 10 arrayed in a grid pattern on the surface (referred to as "chip non-mounting surface" below) on the opposite side of the chip mounting surface of the package substrate 8, and solder outer balls 14 provided on the electrodes 10. The package substrate 8 may also be simply called a "substrate".

The semiconductor chip 9 is a semiconductor element formed from a so-called silicon die, and a circuit is formed on an outer surface 9a of the semiconductor chip 9. A plurality of electrodes 11 for signal input and output are provided, for example, in a grid pattern on the outer surface 9a of the semiconductor chip 9. The FPGA 6 has a mounted structure in which the semiconductor chip 9 is connected to the package substrate 8 with a flip-chip connection (joint) as illustrated in FIG. 3. Specifically, a plurality of electrodes 12 arrayed in a grid pattern on the chip mounting surface of the package substrate 8 and the plurality of electrodes 11 arrayed in a grid pattern on the outer surface 9a side of the semiconductor chip 9 are connected with a solder connection (joint) through very small solder bumps 13.

In this example, the plurality of electrodes 12 provided on the chip mounting surface of the package substrate 8 are disposed in positions that correspond to the plurality of electrodes 11 provided on the outer surface 9a side of the semiconductor chip 9. The solder bumps 13 of the semiconductor chip 9 in the present embodiment are designed so as to have, for example, the dimensions of a diameter $\phi$ of approximately 100 to 200 μm and a pitch of approximately 50 μm. The solder outer balls 14 of the package substrate 8 are also designed to have the dimensions of a diameter $\phi$ of approximately 0.5 mm and a pitch of approximately 1 mm. However, these dimensions are examples and are not limited to the above ranges.

The semiconductor chip 9 and the package substrate 8 exhibit different thermal expansion coefficients in the FPGA 6. As a result, when a heating (temperature) cycle caused by the semiconductor chip 9 being turned on and off is repeated, warping of the package substrate 8 occurs and stress is caused in the solder bumps 13 and the solder outer balls 14 which are the solder connection parts in the FPGA 6. While the traffic bandwidth (flow rate of packet signals) of the FPGA 6 changes from time to time in the FPGA 6 inside the optical transmission device 1, the power consumption also changes due to changes in the traffic bandwidth. As a result, stress is caused in the solder bumps 13 and the solder outer balls 14 due to changes in the traffic bandwidth and changes in the calorific content of the FPGA 6.

Figure 4:
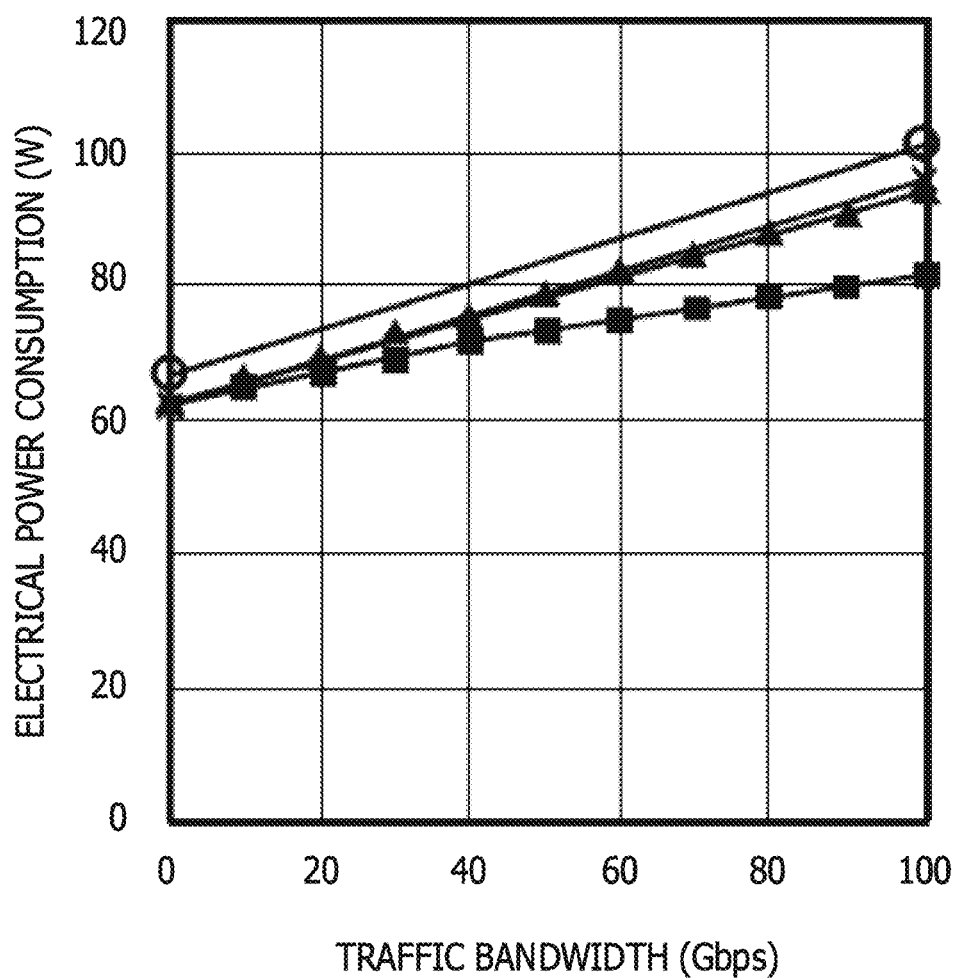
FIG. 4 is a view exemplifying the relationship between power consumption and traffic bandwidth in the FPGA in the optical transmission device according to the embodiment.

FIG. 4 is a view exemplifying a relationship between power consumption and traffic bandwidth in the FPGA 6 in the optical transmission device 1 according to the embodiment. In the example illustrated in FIG. 4, when the power consumption throughout the entire chip in the FPGA 6 reaches approximately 100 W while the traffic bandwidth is 100 Gbps, a difference of approximately 40 W occurs in the power consumption due to changes in the operating conditions of the internal circuits.

While the power consumption when the traffic bandwidth of the FPGA 6 is 90 Gbps is approximately 91 W, the power consumption falls to approximately 70 W when the traffic bandwidth decreases to 20 Gbps. This signifies that when, for example, the thermal resistance value of the main board 4 is 1° C./W, a temperature fluctuation of approximately 20° C. may occur due to a drop in the traffic bandwidth. As described above, the calorific content of the FPGA 6 changes in accordance with the changes in the operating conditions in the semiconductor chip 9 and consequently warping of the package substrate 8 occurs. As a result, the solder bumps 13 and the solder outer balls 14 of the FPGA 6 are subject to stress which leads to damage of the solder connection parts and may lead to disconnections.

In this situation, the warping of the package substrate 8 due to the temperature variation of the semiconductor chip 9 increases further away from the horizontal center of the package substrate 8 and maximum warping is present in the four corner portions. Therefore, the positions corresponding to the solder outer balls 14 disposed to the outside of the solder bumps 13 exhibit a larger amount of warping than the positions corresponding to the solder bumps 13 provided on the semiconductor chip 9. However, the diameters of the solder bumps 13 are smaller than those of the solder outer balls 14. As a result, the solder bumps 13 are weaker with regard to the stress caused by the temperature variation of the semiconductor chip 9 than the solder outer balls 14 in the FPGA 6.

Accordingly, the FPGA 6 of the present embodiment relieves the stress acting on the solder bumps 13 that are more likely to exhibit structural weakness when temperature variations in the semiconductor chip 9 occur. Specifically, the FPGA 6 is equipped with a heating mechanism (heating unit) and the four corners in the horizontal plane of the semiconductor chip 9 are locally heated by the heating mechanism when the temperature while the semiconductor chip 9 is operating (referred to as "operating chip temperature" below) meets or falls below a prescribed temperature. Thus, the temperature fluctuating range among the four corners of the semiconductor chip 9 is reduced and stress on the solder bumps 13 is reduced while the semiconductor chip 9 is operating. The heating mechanism provided in the FPGA 6 is described in more detail below.

Figure 5:
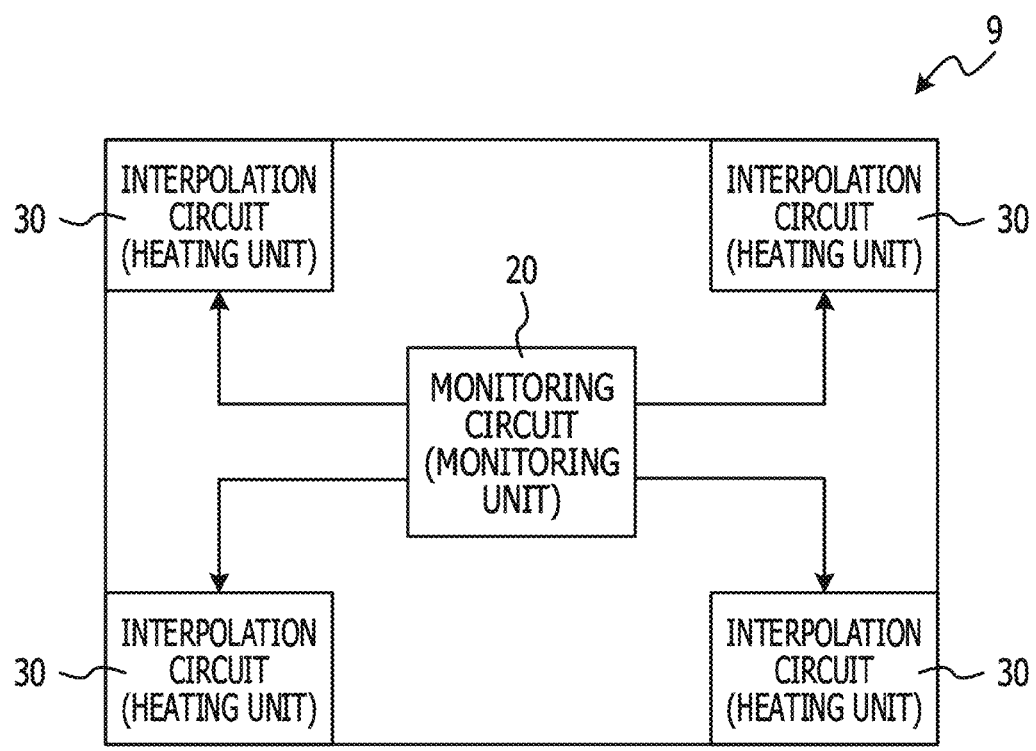
FIG. 5 is a view describing a heating mechanism of the FPGA according to the embodiment.

FIG. 5 is a view describing the heating mechanism of the FPGA according to the embodiment. The above heating mechanism (heating unit) is formed as internal circuits of the semiconductor chip 9 and include a monitoring unit for monitoring the drive rate of the user circuit in the semiconductor chip 9 and heating units for generating heat in response to a control signal from the monitoring unit. The reference numeral 20 in FIG. 5 refers to a monitoring circuit for monitoring the drive rate of the user circuit of the semiconductor chip 9, and is an example of the monitoring unit. The reference numeral 30 refers to an interpolation circuit which is a heating element for generating heat in response to a control signal from the monitoring circuit 20, and is an example of the heating unit. As illustrated in FIG. 5, the interpolation circuits 30 are disposed in the four corners in the horizontal plane of the semiconductor chip 9.

The monitoring circuit 20 may be called a "monitor circuit" and monitors a drive rate Fd of the user circuit on the semiconductor chip 9. The monitoring circuit 20 determines whether the drive rate Fd of the user circuit of the semiconductor chip 9 is at or below a preset prescribed value and outputs an on-signal to the interpolation circuits 30 if the drive rate Fd is equal to or less than the above prescribed value. The interpolation circuits 30 are controlled so as not to generate heat during a time period in which the monitoring circuit 20 is outputting off-signals as control signals as described in more detail below.

Meanwhile, the interpolation circuits 30 are controlled so that the interpolation circuits 30 generate heat during the time period in which the monitoring circuit 20 is outputting the on-signals as the control signals. The FPGA 6 suppresses major stress on the solder bumps 13 by suppressing large fluctuations in temperature even if the fluctuating range of the drive rate Fd of the user circuit in the semiconductor chip 9 is large, by controlling the generation of heat by using the monitoring circuit 20 and the interpolation circuits 30. The drive rate Fd of the user circuit in the semiconductor chip 9 is a switching frequency pertaining to the user circuit switching on and off (signals changing from 1 to 0 and from 0 to 1).

Figure 6:
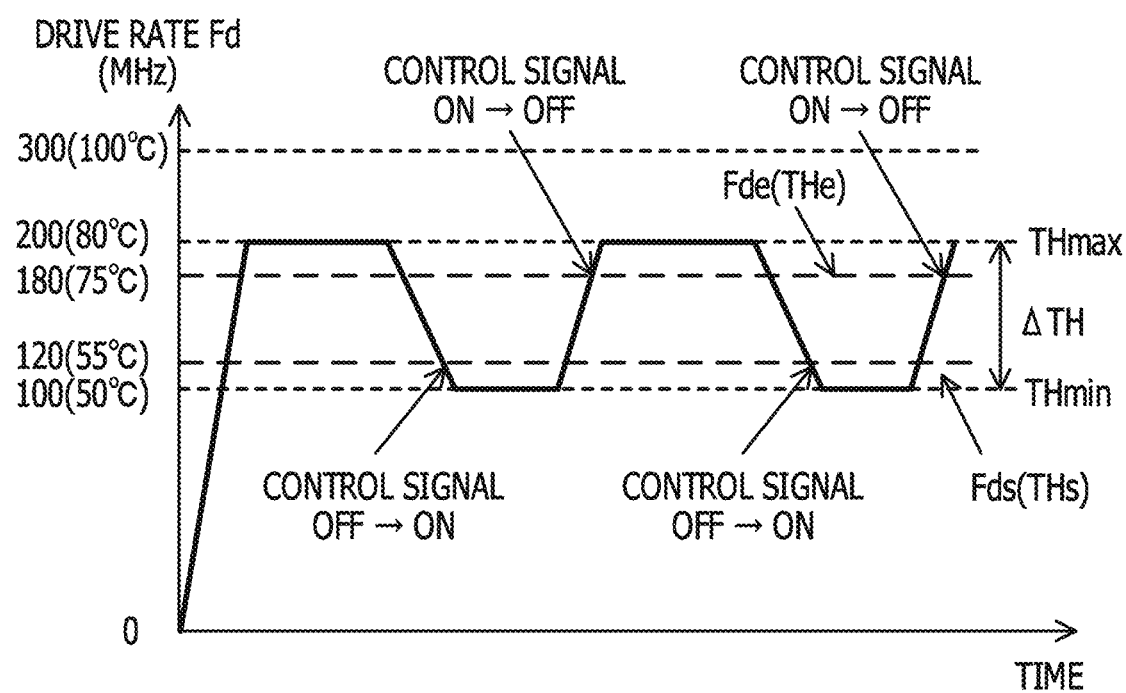
FIG. 6 is a view exemplifying the relationship between a drive rate of a user circuit and an operating state of an interpolation circuit in the semiconductor chip according to the embodiment.

FIG. 6 is a view exemplifying a relationship between the drive rate Fd of the user circuit and an operating state of an interpolation circuits 30 in the semiconductor chip 9 according to the embodiment. An example will be described in which the largest operating drive rate (referred to as "maximum drive rate" below) Fdmax of the user circuit in the semiconductor chip 9 is 200 MHz. That is, the drive rate Fd of the user circuit in the semiconductor chip 9 is able to fluctuate within a range of 0 to 200 MHz in accordance with the traffic bandwidth. The drive rate Fd is 0 MHz when the user circuit in the semiconductor chip 9 is not operating.

Operating chip temperatures TH of the semiconductor chip 9 corresponding to the drive rate Fd of the user circuit are depicted in brackets in the vertical axis in FIG. 6. The operating chip temperature TH corresponding to the drive rate Fd of the user circuit of 200 MHZ is 80° C. in the semiconductor chip 9 in the example illustrated in FIG. 6. Since the maximum value of the drive rate Fd while the user circuit is operating in the semiconductor chip 9 is 200 MHz, it may be understood that the upper limit (referred to as "upper limit temperature THmax" below) of the operating chip temperature TH while the semiconductor chip 9 is operating is 80° C. FIG. 6 depicts an example of a correspondence relation between the drive rate Fd of the user circuit and the operating chip temperature TH.

The FPGA 6 carries out control so that the operating chip temperature TH while the semiconductor chip 9 is operating does not meet or fall below a lower limit temperature THmin. The lower limit temperature THmin is a temperature defined based on the upper limit temperature THmax and an allowable temperature fluctuating range ΔTH of the semiconductor chip 9. The lower limit temperature THmin is set, for example, to a temperature derived by subtracting the allowable temperature fluctuating range ΔTH from the upper limit temperature THmax.

An example of a method for setting the allowable temperature fluctuating range ΔTH will be described next. The allowable temperature fluctuating range ΔTH may be derived, for example, from a lifetime calculation under actual environmental conditions of the temperature variations of the solder bumps 13 which are the solder joint parts of the semiconductor chip 9.

FIG. 7 is a view for illustrating allowable numbers of cycles Na corresponding to the allowable temperature fluctuating range ΔTH and the upper limit temperature THmax. Upper limit temperatures Tmax are set to three levels of 40° C., 60° C., and 80° C., and allowable temperature fluctuating ranges ΔTH is set to three levels of 10° C., 20° C., and 30° C. in FIG. 7. The allowable numbers of cycles Na is determined for each combination of the upper limit temperatures THmax and the allowable temperature fluctuating ranges ΔTH. The unit for the allowable numbers of cycles Na is times per day.

For example, the allowable numbers of cycles Na is derived as the maximum number of cycles per day for which a lifetime of 20 years for the solder joint parts of the semiconductor chip 9 may be guaranteed, as a parameter of the upper limit temperature THmax and the allowable temperature fluctuating range ΔTH while the semiconductor chip 9 is operating.

As illustrated in FIG. 7, the allowable numbers of cycles Na decreases as the allowable temperature fluctuating range ΔTH increases under the same upper limit temperature THmax condition. The allowable numbers of cycles Na decreases as the upper limit temperature THmax increases under the same allowable temperature fluctuating range ΔTH condition. For example, if a temperature fluctuation of 20° C. exceeds 2.5 times in one day during operations when the upper limit temperature THmax of the semiconductor chip 9 is 80° C., there is a concern that the solder bumps 13 of the semiconductor chip 9 may be damaged enough to lead to a disconnection.

The allowable temperature fluctuating range ΔTH is preferably set so that the allowable number of cycles Na corresponding to the upper limit temperature THmax is relatively large, and the lower limit temperature THmin is preferably set based on the allowable temperature fluctuating range ΔTH and the upper limit temperature THmax. For example, if it is determined that it would be enough to increase the allowable number of cycles Na to 20 times/day, it may be seen in FIG. 7 that the allowable temperature fluctuating range ΔTH with regard to the semiconductor chip 9 when the upper limit temperature THmax is 80° C. may be set to 10° C. In this way, the allowable temperature fluctuating range ΔTH is set in association with the upper limit temperature THmax and the allowable number of cycles Na of the semiconductor chip 9, and the lower limit temperature THmin may be set based on the upper limit temperature THmax and the allowable temperature fluctuating range ΔTH.

Next, heat generation control of the semiconductor chip 9 will be described with reference to FIG. 6 using an example in which the lower limit temperature THmin is set to 70° C. with regard to the semiconductor chip 9 having an upper limit temperature THmax of 80° C. while operating. The heating control of the present embodiment involves carrying out control so that the operating chip temperature TH of the semiconductor chip 9 transitions between the lower limit temperature THmin and the upper limit temperature THmax, that is, so that the operating chip temperature TH does not fall below the lower limit temperature THmin. In the present embodiment, a heating start setting temperature THs is set, for example, as a temperature higher than the lower limit temperature THmin by a prescribed margin. When the drive rate Fd of the user circuit monitored by the monitoring circuit 20 becomes equal to or less than a heating start setting drive rate Fds corresponding to the heating start setting temperature THs, the monitoring circuit 20 outputs the on-signals. Although explained in more detail below, the interpolation circuits 30 disposed in the four corners within the horizontal plane of the semiconductor chip 9 begin generating heat whenever the monitoring circuit 20 outputs an on-signal. As a result, the operating chip temperature TH of the semiconductor chip 9 is inhibited from falling below the lower limit temperature THmin.

Moreover, a heating finish setting temperature THe is set as a temperature lower than the upper limit temperature THmax by a prescribed margin, and a heating stop setting drive rate Fde is set as the drive rate Fd of the user circuit corresponding to the heating finish setting temperature THe in the present embodiment. When the drive rate Fd of the user circuit monitored by the monitoring circuit 20 meets or exceeds the heating stop setting drive rate Fde while the monitoring circuit 20 is outputting on-signals, the monitoring circuit 20 switches the output signals from the on-signals to the off-signals. As a result, the generation of heat by the interpolation circuits 30 disposed in the four corners of the semiconductor chip 9 is stopped and consequently the operating chip temperature TH of the semiconductor chip 9 is inhibited from exceeding the upper limit temperature THmax.

The power consumption of a logical circuit is determined according to a load capacity C×a voltage V×the drive rate Fd of the circuit. Because the load capacity C and the voltage V pertaining to the user circuit are fixed, the operating chip temperature TH rises as a result of the power consumption rising in correspondence to a rise in the drive rate Fd of the user circuit. Similarly, the operating chip temperature TH falls as a result of the power consumption falling in correspondence to a fall in the drive rate Fd of the user circuit. In this way, the drive rate Fd of the user circuit and the operating chip temperature TH may be associated with each other. Thus, the heating start setting drive rate Fds and the heating stop setting drive rate Fde corresponding respectively to the heating start setting temperature THs and the heating finish setting temperature THe as described above may be derived.

Figure 8:
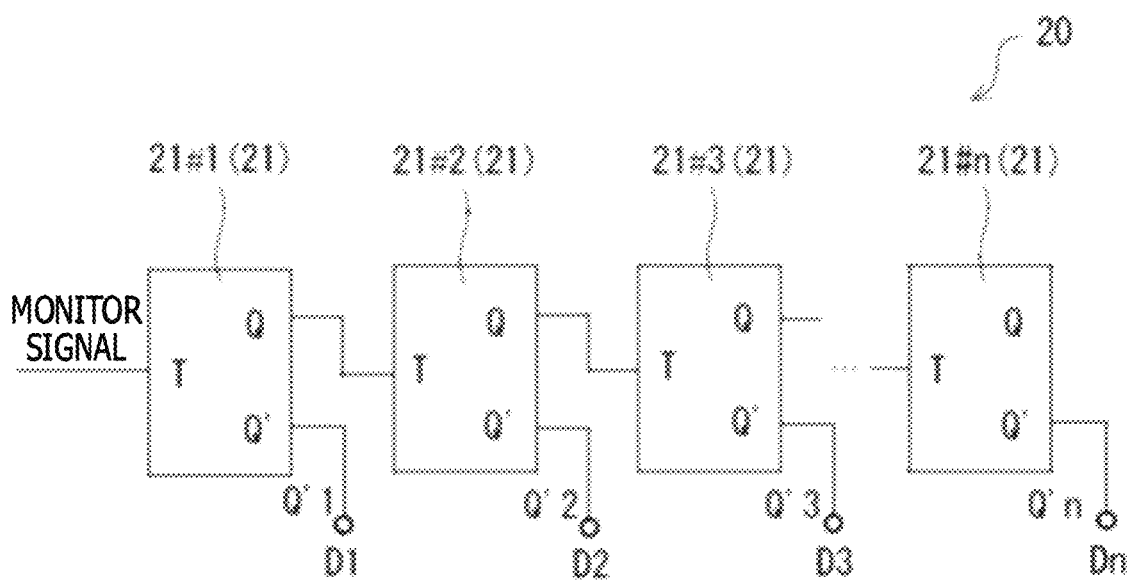
FIG. 8 is a block diagram illustrating an example of a monitor circuit according to the embodiment.

The monitoring circuit 20 of the semiconductor chip 9 will be described in detail next. FIG. 8 is a block diagram illustrating an example of the monitor circuit 20 according to the embodiment. The monitoring circuit 20 is a circuit for monitoring the drive rate (switching frequency) Fd of the user circuit in the semiconductor chip 9 as described above and includes a plurality of flipflops (FF) 21. A flipflop is a logical circuit that holds a current input signal due to a control signal. The monitoring circuit 20 is used as a counter and is referred to as a first flipflop 21#1, a second flipflop 21#2, . . . , and a nth flipflop 21#n in order from the top.

A monitor signal is inputted as an input signal T into the input terminal of the first flipflop 21#1. The monitor signal is a pulse signal that displays the operating state (ON="1 (Hi)", OFF="0 (Lo)") of the user circuit. The output terminals of the flipflops 21 are connected to the input terminals of the subsequent flipflops 21. The flipflops 21 holds the state of the input signal T at the moment (referred to as "rising edge" hereinbelow) that the input signal T inputted into the input terminal switches from 0 (Lo) to 1 (Hi) until the next rising edge, and outputs an output signal Q and an inverted output signal Q'. The flipflops 21 reverse the output signal Q and the inverted output signal Q' which are synchronized to the rising edge of the input signal T. The inverted output terminals of the flipflops 21#1, 21#2, . . . , 21#n are connected to terminals D1, D2, . . . , Dn and supply the respective inverted output signals Q' to the terminals D1, D2, . . . , Dn. The signals supplied to the terminals D1, D2, . . . , Dn are herein referred to respectively as Q'1, Q'2, . . . , Q'n.

Figure 9:
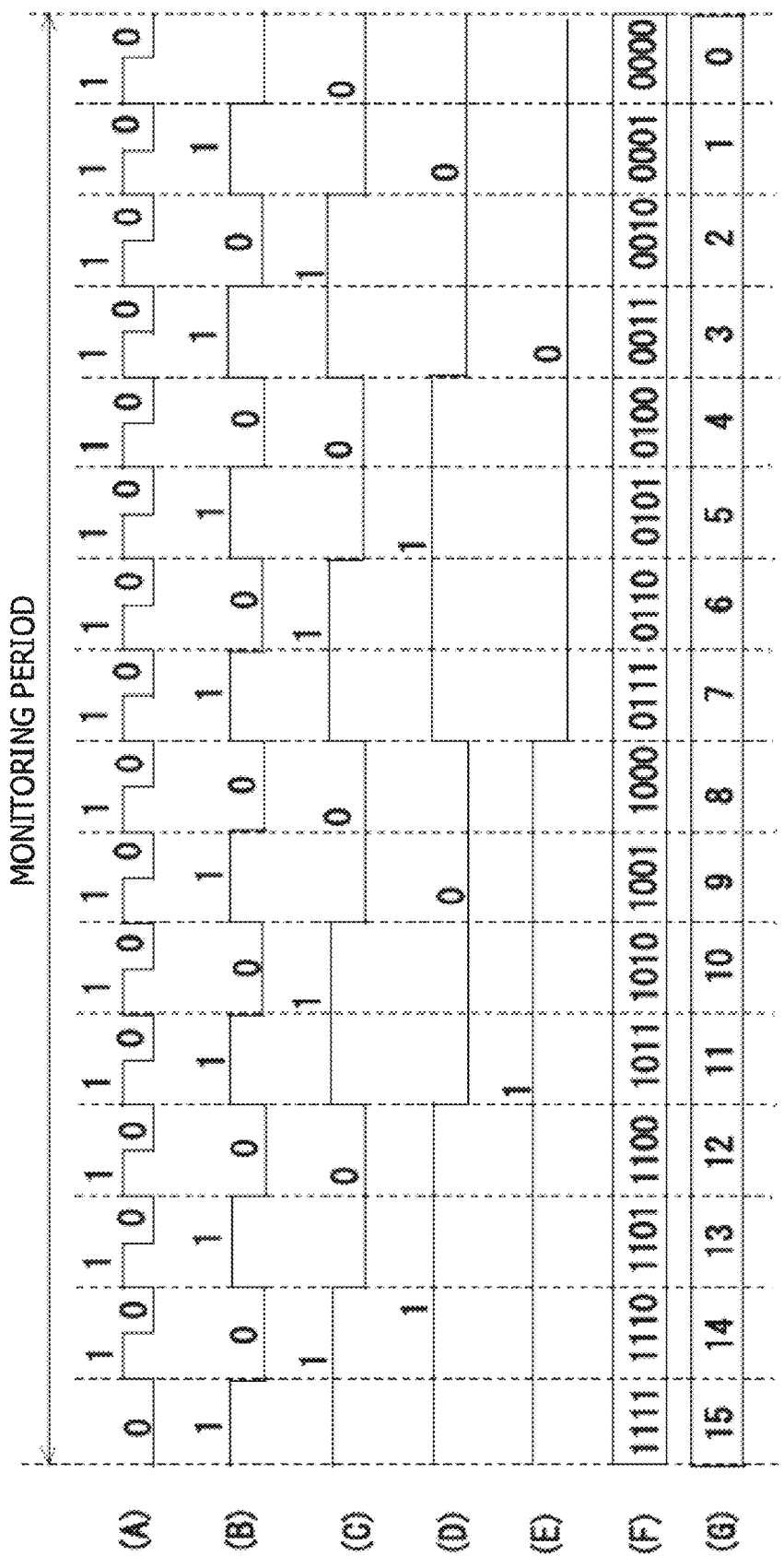
FIG. 9 is a timing chart (1) illustrating an example of operations of the monitor circuit according to the embodiment.

The method for calculating the drive rate Fd of the user circuit using the monitoring circuit 20 will be described next. The method for calculating the drive rate Fd and an operating example of the monitoring circuit 20 including four flipflops 21 will be explained for convenience. FIG. 9 is a timing chart illustrating an operating example of the monitoring circuit 20 during a prescribed monitoring period. The time transition of the monitor signal is indicated in row (A) and the respective time transitions of the inverted output signals Q'1 to Q'4 supplied to the respective terminals D1 to D4 are indicated by rows (B) to (E). A line of the states ("0" or "1") of Q'4, Q'3, Q'2, and Q'1 at each timing is indicated with binary digits in row (F). Values after the binary digits indicated in (F) are converted to decimal digits are indicated in row (G) and these values are referred to below as the "count values".

The flipflops 21 reverse (0 to 1 or 1 to 0) the output signal Q and the inverted output signal Q' which are synchronized to the rising edge of the input signal T as described above. As a result, the output signal Q and the inverted output signal Q' from the flipflops 21 are outputted as a pulse of ½ of the frequency of the input signal T frequency. Therefore, the frequency of the inverted output signal Q' supplied to the terminal D1 is ½ of the monitor signal frequency as illustrated in FIG. 9. Similarly, the frequencies of the inverted output signals Q' supplied to the terminals D2, D3, and D4 are ½ of the inverted output signals Q' supplied to the respective terminals D1, D2, and D3.

The number of switches is reduced by one in synchronization with the rising edge where the monitor signal changes from 0 to 1 as illustrated in row (G). In this way, the monitoring circuit 20 forms a circuit construction in which the switching cycle of the monitor signal changing from 0 to 1 or from 1 to 0 matches a cycle in which the count value is reduced by one. The number of switches during the monitoring period may be easily derived and the drive rate Fd may be derived from the number of switches through the use of the abovementioned monitoring circuit 20.

For example, the count value is "15" at the start of the monitoring period and the count value becomes "0" at the end of the monitoring period in the example illustrated in FIG. 9. Consequently this signifies that the number of switches in the monitoring period is 15. The number of switches in the monitoring period corresponds to the subtraction of the count value at the end of the monitoring period from the count value at the start of the monitoring period. The drive rate Fd which is the number of switches per unit of time may be derived by dividing the number of switches derived in this way by the monitoring period.

Figure 10:
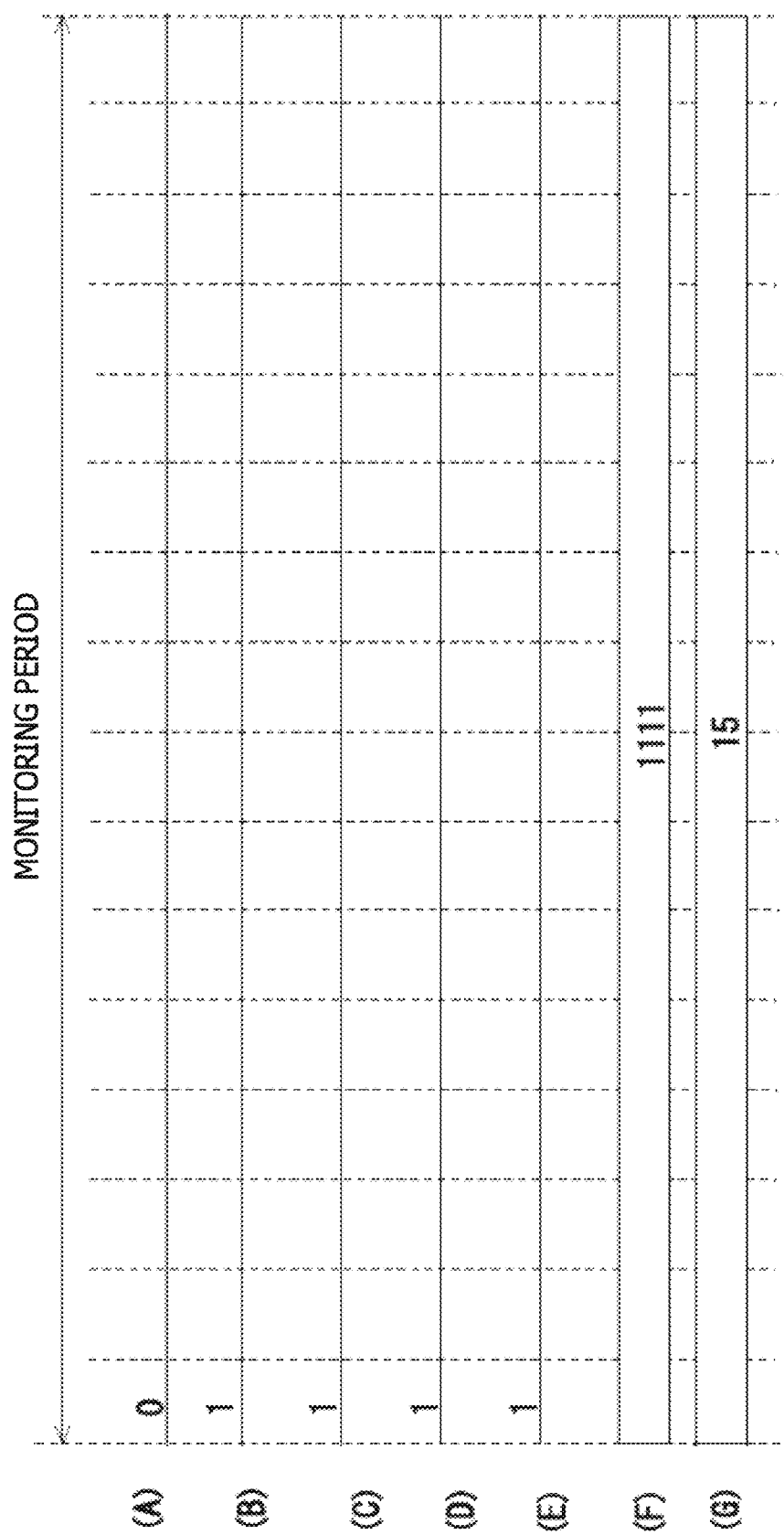
FIG. 10 is a timing chart (2) illustrating an example of operations of the monitor circuit according to the embodiment.

While a case has been described in which the monitor signals supplied to the monitoring circuit 20 switch in a pulsating manner over the monitoring period has been described with reference to FIG. 9, a case in which the monitor signal in the monitoring period is held at "0" from the start to the end is described with reference to FIG. 10. The rows (A) to (G) in FIG. 10 correspond to the rows (A) to (G) n FIG. 9. The monitor signal is held at "0" during the monitoring period as illustrated in row (A) in FIG. 10. As a result, the inverted output signals Q'1 to Q'4 supplied to the respective terminals D1 to D4 are held at "1" during the monitoring period. That is, the line of Q'4, Q'3, Q'2, and Q'1 indicated in row (F) is held at "1111" in binary digits, and the count value indicated in row (G) is also held at "15"

during the monitoring period. In this way, the fact that the count value during the monitoring period does not change (does not decrease) signifies that the number of switches during the monitoring period is zero and that the drive rate Fd is zero.

The number of flipflops 21 included in the monitoring circuit 20 increases in correspondence to an increase in the maximum count value of the number of switches of the user circuit in the semiconductor chip 9 that may be counted. The drive rate Fd of the user circuit having a higher maximum drive rate Fdmax may be monitored by reducing the monitoring period if the number of flipflops 21 included in the monitoring circuit 20 is the same. Therefore, the number of flipflops 21 in the monitoring circuit 20 may be set in correspondence to the monitoring period for monitoring the maximum drive rate Fdmax and the drive rate Fd of the user circuit in the semiconductor chip 9. For example, the number of flipflops 21 included in the monitoring circuit 20 may be increased in correspondence to a higher maximum drive rate Fdmax of the user circuit or in correspondence to a longer monitoring period.

The following depicts a detailed example in which the monitoring period is set to 1 second and the drive rate Fd of the user circuit with a maximum drive rate Fdmax of 200 MHz is calculated by the monitoring circuit 20 in which 28 flipflops 21 are connected in series. In this example, because the number of flipflops 21 included in the monitoring circuit 20 is 28, a binary digit of 28 digits may be obtained when the inverted output signals Q'28, Q'27, . . . , Q'1 supplied to the respective terminals D28, D27, . . . , D1 are arranged in order. The count value (decimal digit) at the start and the end of the monitoring period is derived herein. For example, it is assumed herein that the count value (decimal digit) at the start of the monitoring period is 268435455, and the count value (decimal digit) at the end of the monitoring period is 68435455. In this case, because the number of switches during the monitoring period (1 second) is 200 million times (268435455−68435455=200000000), the current drive rate Fd of the user circuit is calculated to be 200 MHz.

Moreover, when for example the count value (decimal digits) at the start of the monitoring period is 268435455 and the count value (decimal digits) at the end of the monitoring period is 218435455, the number of switches during the monitoring period (1 second) is 50 million times. In this case, the current drive rate Fd of the user circuit is calculated to be 50 MHz. Moreover, it is assumed for example that the count value (decimal digit) at the start of the monitoring period is 268435455, and the count value (decimal digit) at the end of the monitoring period is 268435455. In this case, because the number of switches during the monitoring period (1 second) is zero times, the current drive rate Fd of the user circuit is calculated to be 0 MHz.

The monitoring circuit 20 in the semiconductor chip 9 monitors the drive rate Fd of the user circuit in the semiconductor chip 9 as described above. If the drive rate Fd obtained when the control signals currently outputted by the monitoring circuit 20 are off-signals is equal to or less than the heating start setting drive rate Fds, the monitoring circuit 20 switches the outputted control signals from the off-signals to the on-signals, and if the obtained drive rate Fd is greater than the heating start setting drive rate Fds, the monitoring circuit 20 continues to output the off-signals. Conversely, if the drive rate Fd obtained when the control signals currently outputted by the monitoring circuit 20 are on-signals is equal to or greater than the heating stop setting drive rate Fde, the monitoring circuit 20 switches the outputted control signals from the on-signals to the off-signals, and if the obtained drive rate Fd is not greater than the heating stop setting drive rate Fde, the monitoring circuit 20 continues to output the on-signals.

The following is an explanation of the interpolation circuits 30 disposed in the four corners of the semiconductor chip 9. The control signals outputted by the monitoring circuit 20 are supplied to the interpolation circuits 30, and the interpolation circuits 30 generate heat when the control signal is an on-signal, and stop generating heat when the control signal is an off-signal.

Figure 11:
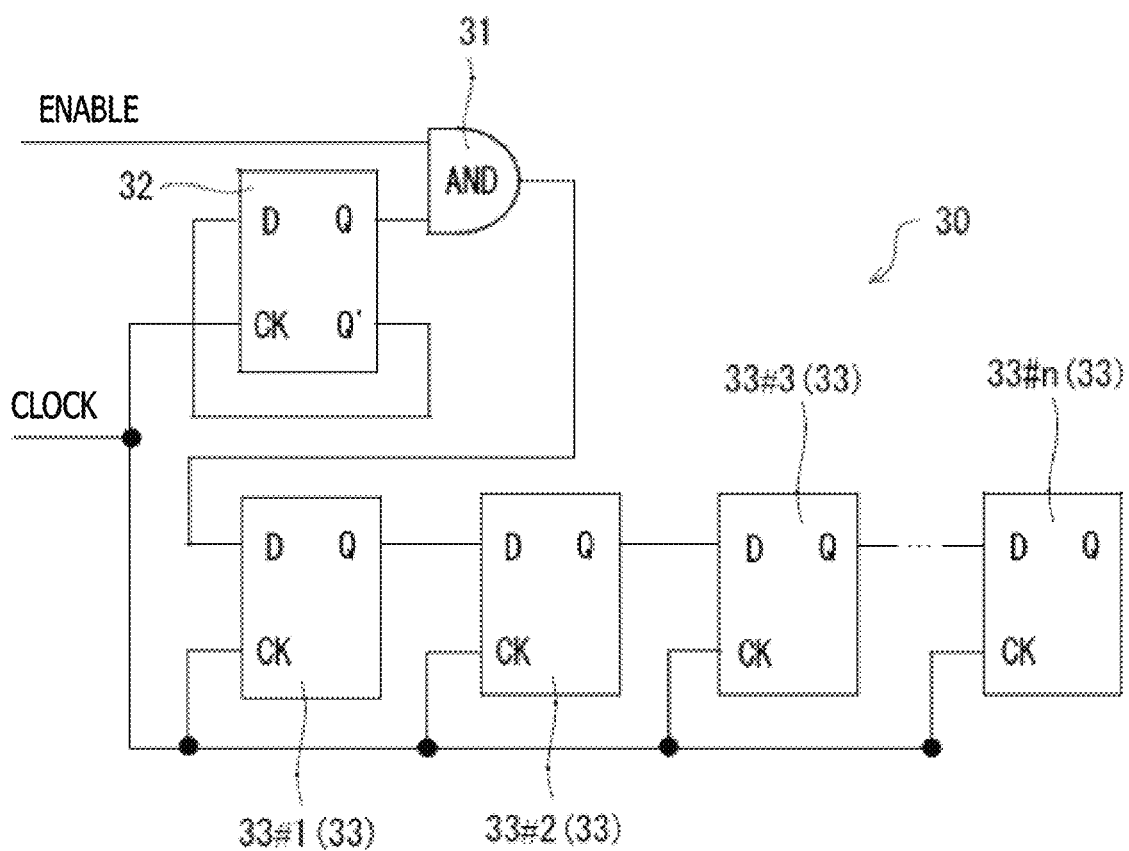
FIG. 11 is a block diagram illustrating an example of an interpolation circuit according to the embodiment.

FIG. 11 is a block diagram illustrating an example of the interpolation circuit 30. The interpolation circuit 30 includes an AND gate 31, a D-type flipflop 32, and a plurality of D-type flipflops 33#1, 33#2, . . . , 33#n. The symbol "enable" in FIG. 11 refers to an enable signal EN which is the control signal outputted by the monitoring circuit 20. The enable signal EN is supplied to the AND gate 31 through a terminal 34. The symbol "clock" in FIG. 11 refers to a clock signal CK which is supplied from a terminal 35 and supplied to clock input terminals of the D-type flipflop 32 and the plurality of D-type flipflops 33#1, 33#2, . . . , 33#n.

The D-type flipflop 32 holds the state of an input signal D at the rising edge when the clock signal CK inputted into the clock input terminals switches from "0 (Lo)" to "1 (Hi)", until the next rising edge of the clock signal CK, and outputs the signal as the output signal Q. The D-type flipflop 32 inverts the state of the output signal Q each time the clock signal CK is applied, by feeding the inverted output signal Q' of the input signal D back to the input terminal. The output signal Q from the D-type flipflop 32 is supplied to the input terminal of the AND gate 31. The AND gate 31 outputs the "1 (Hi)" signal from the output terminal only when the input signals inputted into the two input terminals are both "1 (Hi)", and in any other case, outputs the "0 (Lo)" signal. The enable signal EN is inputted into one of the input terminals of the AND gate 31, and the output signal Q from the D-type flipflop 32 is inputted into the other of the input terminals.

The plurality of D-type flipflops 33#1, 33#2, . . . , 33#n are connected in series. The plurality of D-type flipflops 33#1, 33#2, . . . , 33#n are referred to as a first D-type flipflop 33#1, a second D-type flipflop 33#2, . . . , and an nth D-type flipflop 33#n in order from the top, and are collectively referred to as the "D-type flipflop 33". The D-type flipflop 33 holds the input signal D in synchronization with the rising edge of the inputted clock signal CK, and outputs the output signal Q.

Figure 12:
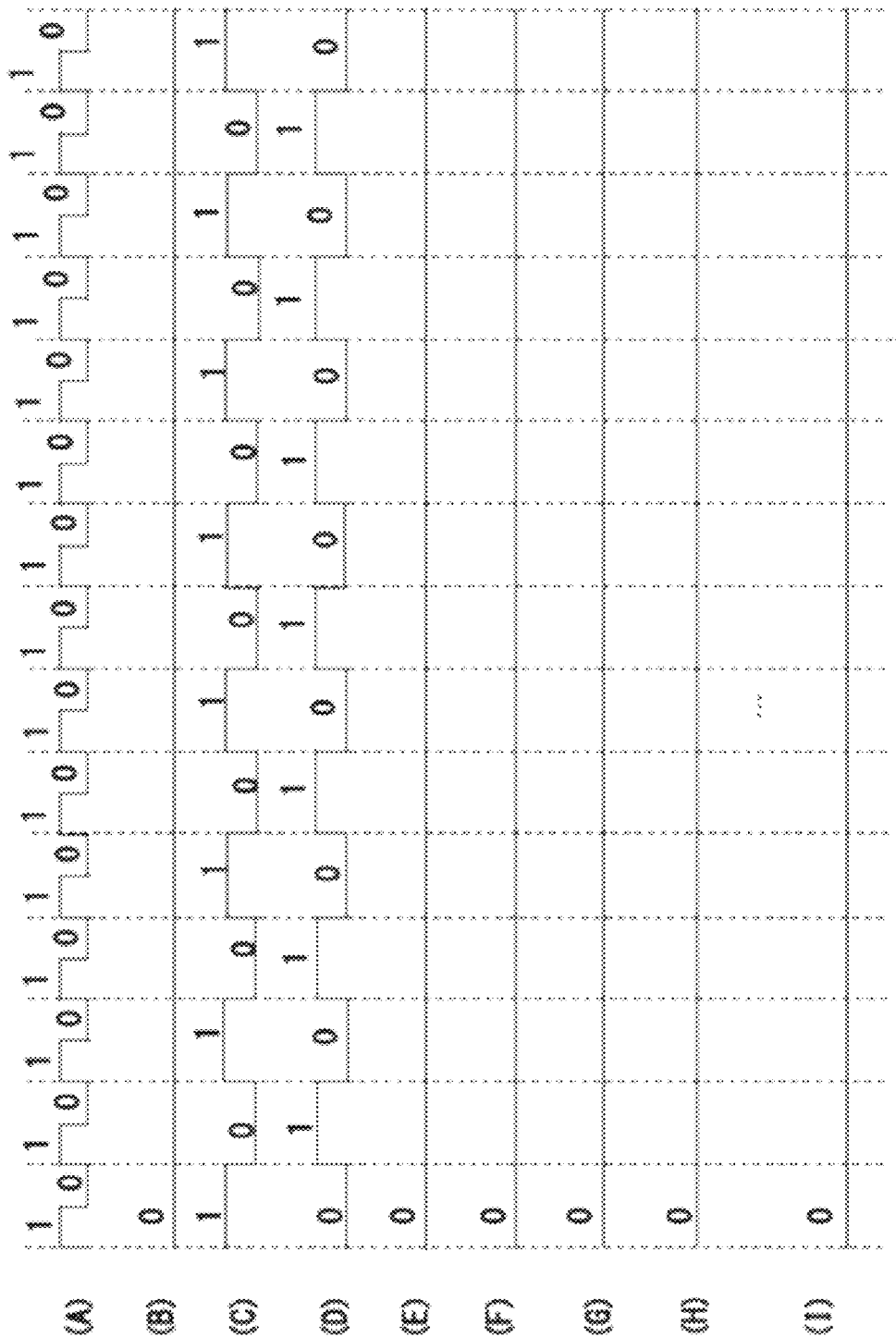
FIG. 12 is a timing chart (1) illustrating an example of operations of the interpolation circuit according to the embodiment.
Figure 13:
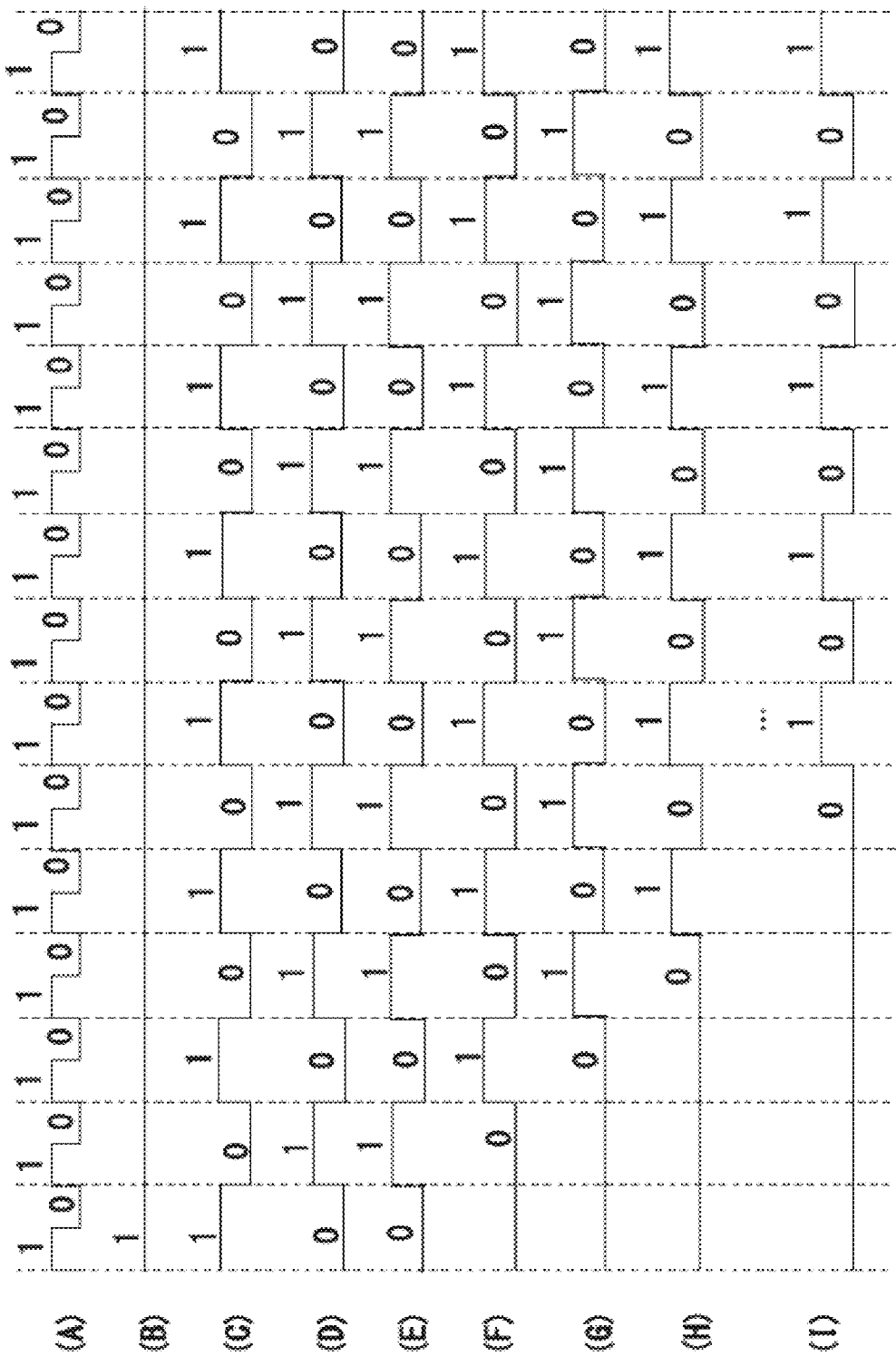
FIG. 13 is a timing chart (2) illustrating an example of operations of the interpolation circuit according to the embodiment.

FIGS. 12 and 13 are timing charts illustrating operating examples of the interpolation circuits 30 according to the present embodiment. FIG. 12 illustrates an operating example when the enable signal EN supplied to the interpolation circuits 30 is "0 (Lo)" (e.g., when the control signals outputted by the monitoring circuit 20 are off-signals). Conversely, FIG. 13 illustrates an operating example when the enable signal EN supplied to the interpolation circuits 30 is "1 (Hi)" (e.g., when the control signals outputted by the monitoring circuit 20 are on-signals). The row (A) in FIGS. 12 and 13 depicts the time transition of the clock signal CK, and the row (B) depicts the time transition of the enable signal EN. The row (C) depicts the time transition of the inverted output signal Q' of the D-type flipflop 32, and the row (D) depicts the time transition of the output signal Q of the D-type flipflop 32. The row (E) depicts the time transition of the output signal of the AND gate 31. The rows (F), (G), and (H) depict the respective time transitions of the output signals Q of the first D-type flipflop 33#1, the second D-type flipflop 33#2, and the nth D-type flipflop 33#n.

The D-type flipflop 32 holds the input signal D in synchronization with the rising edge of the clock signal CK and the inverted output signal Q' is supplied to the input terminal of the D-type flipflop 32. Consequently, if the inverted output signal Q' of the D-type flipflop 32 is "1", the input signal D is held at "1" at the rising edge of the clock signal CK and "1" is outputted as the output signal Q and "0" is outputted as the inverted output signal Q'. In this way, when the inverted output signal Q' is inverted from 1 to 0, the output signal Q is inverted from 1 to 0 and the inverted output signal Q' is inverted from 0 to 1 at the next rising edge of the clock signal CK. In this way, the output signal Q (see row (D)) of the D-type flipflop 32 is outputted as a pulse with a frequency that is ½ of the clock frequency of the clock signal CK (see row (A)) as illustrated in FIGS. 12 and 13.

As illustrated in row (B) in FIG. 12, the enable signal EN inputted to the interpolation circuit 30 is maintained at "0". The interpolation circuits 30 generate heat in the D-type flipflops 33 when the enable signal EN is "1 (Hi)" and stop the generation of heat in the D-type flipflops 33 when the enable signal EN is "0 (Lo)". The following is a detailed explanation of the above.

Because the output signal of the AND gate 31 is inputted into the first D-type flipflop 33#1 as the input signal D, the input signal D of the first D-type flipflop 33#1 is also held at "0" over the period in which the enable signal EN is held at "0". However, a switching current is applied to the D-type flipflops 33 when the output signals Q thereof are switched from 0 to 1 or from 1 to 0. As a result, electrical power is consumed by the D-type flipflops 33 and heat is generated. Conversely, when the enable signal EN supplied to the interpolation circuits 30 is held at "0" as illustrated in FIG. 12, the output signals Q of the D-type flipflops 33 are also held at "0" and the interpolation circuits 30 do not generate heat.

Conversely, when the enable signal EN supplied to the interpolation circuits 30 is maintained at "1" as illustrated in row (B) in FIG. 13, the output signal of the AND gate 31 is switched from 0 to 1 or from 1 to 0 in synchronization with the output signal Q of the D-type flipflop 32. When the output signal of the AND gate 31 is supplied to the first D-type flipflop 33#1, the first D-type flipflop 33#1 holds and outputs the input signal D in synchronization with the rising edge of the clock signal CK. As a result, the output signal Q of the first D-type flipflop 33#1 is synchronized with the output signal of the AND gate 31 and switches at a switching frequency that is ½ of the clock frequency (see row (F) in FIG. 13). The output signal Q of the first D-type flipflop 33#1 is inputted into the subsequent second D-type flipflop 33#2, and the output signal Q of the second D-type flipflop 33#2 switches in synchronization with the output signal Q of the first D-type flipflop 33#1.

In this way, switching of the output signals Q of the plurality of D-type flipflops 33 is conducted at a switching frequency that is ½ of the clock frequency in FIG. 13 (see rows (F) to (H) in FIG. 13). A switching current is applied whenever a switch of the output signal Q occurs in the D-type flipflops 33 and electrical power is consumed. As a result, the generation of heat occurs in the D-type flipflops 33. That is, the interpolation circuits 30 generate heat.

As described above, the monitoring circuit 20 monitors the drive rate Fd of the user circuit in the semiconductor chip 9 and outputs on-signals when the drive rate Fd is equal to or less than the heating start setting drive rate Fds in the semiconductor chip 9 of the FPGA 6 according to the present embodiment. When the on-signals are outputted by the monitoring circuit 20, the interpolation circuits 30 disposed in the four corners of the semiconductor chip 9 generate heat as described above. The heating start setting drive rate Fds at the start of the generation of heat by the interpolation circuits 30 is associated with the heating start setting temperature THs. As a result, the heating control according to the present embodiment may also be said to be the control of the generation of heat in the four corners of the semiconductor chip 9 when the operating chip temperature TH of the semiconductor chip 9 is equal to or less than the heating start setting temperature THs.

Figure 14:
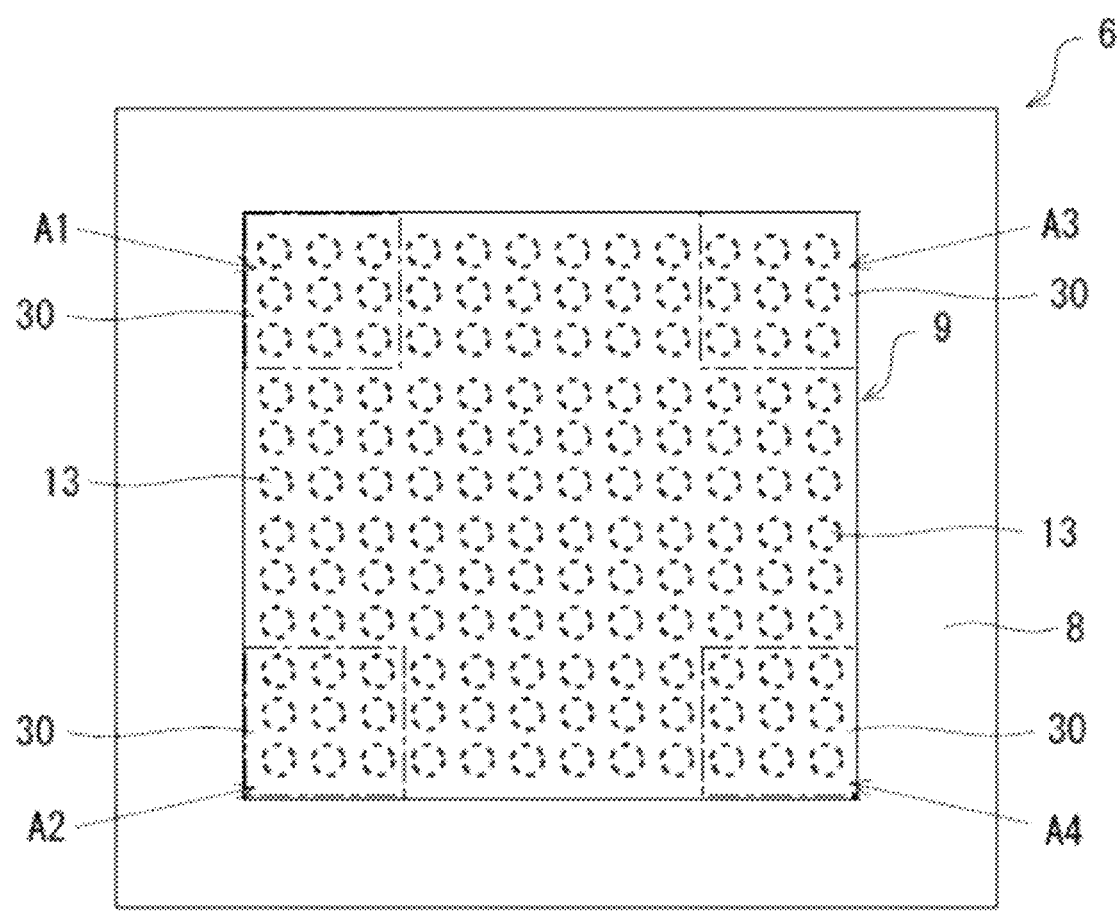
FIG. 14 is a view exemplifying disposition regions for interpolation circuits within the horizontal plane of a semiconductor chip according to the embodiment.

FIG. 14 is a view exemplifying disposition regions for the interpolation circuits 30 within the horizontal plane of the semiconductor chip 9 according to the embodiment. FIG. 14 illustrates the FPGA 6 from above. As illustrated in FIG. 14, the interpolation circuits 30 are each disposed in regions A1 to A4 in the four corners of the semiconductor chip 9. The ranges in which the interpolation circuits 30 are disposed are indicated by the chain lines in FIG. 14. When the drive rate Fd while the user circuit in the semiconductor chip 9 is operating is equal to or less than the heating start setting drive rate Fds, the regions A1 to A4 in the four corners of the semiconductor chip 9 are locally heated by the interpolation circuits 30.

As a result, the operating chip temperature TH of the semiconductor chip 9 during operation is inhibited from falling below the lower limit temperature THmin. As a result, the fluctuating range of the operating chip temperature TH may be reduced in the four corners of the semiconductor chip 9 which is structurally weak with regard to stress caused by temperature variations. As a result, the amount of warping caused by the difference in the thermal expansion coefficient between the semiconductor chip 9 and the package substrate 8 may be reduced in the four corners of the semiconductor chip 9, and the effect of stress on the solder bumps 13 in the four corners of the semiconductor chip 9 may be reduced. As a result, damage such as cracking on the solder bumps 13 disposed in the four corners of the semiconductor chip 9 may be suppressed. That is, damage that may lead to disconnections in the solder joint parts is suppressed and the connection reliability may be improved.

In particular, damage to the solder bumps 13 may be further suppressed in a suitable manner due to the interpolation circuits 30 being disposed in each of the four corners of the semiconductor chip 9 which is easily affected by stress during the operation of the semiconductor chip 9. However, the interpolation circuits 30 are not necessarily disposed in all of the four corners of the semiconductor chip 9. That is, the effect of limiting damage to the solder bumps 13 may be demonstrated by the generation of heat locally in at least one of the four corners when the operating chip temperature TH of the semiconductor chip 9 is equal to or below a prescribed temperature. Moreover, because the heating mechanism for locally generating heat in the four corners of the semiconductor chip 9 is formed by logical circuits such as the monitoring circuit 20 and the interpolation circuits 30, the abovementioned heating control may be accomplished in one chip.

The sum total of the calorific content throughout all of the interpolation circuits 30 may be increased in correspondence to an increase in the number of D-type flipflops 33 connected in series in the interpolation circuits 30. Accordingly, the number of D-type flipflops 33 included in the interpolation circuits 30 is desirably set in accordance with the calorific content expected from the interpolation circuits 30. For example, if the power consumption when the switching current is applied to the D-type flipflops 33 is 10 mW, 1,000 D-type flipflops 33 may be connected in series in order to interpolate 10 W. In this way, the interpolation circuits 30 may easily generate the expected amount of calorific content due to the adjustment of the number of D-type flipflops 33 connected in series.

While a semiconductor device and an electronic device according to the embodiment have been described above, it would be obvious to a person skilled in the art that various changes, modifications, and combinations are possible in the above embodiment. For example, the FPGA 6 may be provided with a temperature sensor for detecting the operating chip temperature of the semiconductor chip 9, and the on/off state of the interpolation circuits 30 may be controlled based on the operating chip temperature detected by the temperature sensor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
a substrate;
a semiconductor chip mounted over the substrate and having a solder bump coupled by soldering with an electrode over the substrate, the semiconductor chip including
a field-programmable gate arrays circuit,
a monitoring circuit that monitors a switching frequency of the field-programmable gate arrays circuit, and
four heating circuits that are located in four corners of a surface of the semiconductor chip,
wherein the monitoring circuit outputs an on-signal to the four heating circuits when the switching frequency of the field-programmable gate arrays circuit is equal to or less than a preset prescribed value, and
the four heating circuits begin generating heat when the monitoring circuit outputs the on-signal.

2. The semiconductor device according to claim 1, wherein
the monitoring circuit and the four heating circuits are logical circuits formed on the semiconductor chip.

3. An electronic device comprising:
a semiconductor device having:
a substrate;
a semiconductor chip mounted over the substrate and having a solder bump coupled by soldering with an electrode over the substrate, the semiconductor chip including
a field-programmable gate arrays circuit,
a monitoring circuit that monitors a switching frequency of the field-programmable gate arrays circuit, and
four heating circuits that are located in four corners of a surface of the semiconductor chip,
wherein the monitoring circuit outputs an on-signal to the four heating circuits when the switching frequency of the field-programmable gate arrays circuit is equal to or less than a preset prescribed value, and
the four heating circuits begin generating heat when the monitoring circuit outputs the on-signal.

* * * * *